(12) United States Patent
Mu et al.

(10) Patent No.: US 9,192,053 B2
(45) Date of Patent: Nov. 17, 2015

(54) METHOD FOR MANUFACTURING ION OPTICAL DEVICE

(71) Applicant: SHIMADZU RESEARCH LABORATORY (SHANGHAI) CO. LTD., Shanghai (CN)

(72) Inventors: Hui Mu, Shanghai (CN); Gongyu Jiang, Shanghai (CN); Li Ding, Shanghai (CN); Jianliang Li, Shanghai (CN); Wenjian Sun, Shanghai (CN)

(73) Assignee: SHIMADZU RESEARCH LABORATORY (SHANGHAI) CO. LTD., Shanghai (CN)

( * ) Notice: Subject to any disclaimer, the term of this patent is extended or adjusted under 35 U.S.C. 154(b) by 21 days.

(21) Appl. No.: 14/094,132

(22) Filed: Dec. 2, 2013

(65) Prior Publication Data

US 2014/0087063 A1 Mar. 27, 2014

Related U.S. Application Data

(63) Continuation of application No. PCT/CN2012/076196, filed on May 29, 2012.

(30) Foreign Application Priority Data

Jun. 1, 2011 (CN) .......................... 2011 1 0146810

(51) Int. Cl.
*B05D 5/12* (2006.01)
*H05K 3/10* (2006.01)
(Continued)

(52) U.S. Cl.
CPC ................ *H05K 3/107* (2013.01); *B05D 3/002* (2013.01); *B05D 5/12* (2013.01); *C23C 14/34* (2013.01);
(Continued)

(58) Field of Classification Search
USPC ..................... 427/98.5, 98.6, 98.8, 162, 307; 250/290, 293
See application file for complete search history.

(56) References Cited

U.S. PATENT DOCUMENTS 2,544,934 A * 3/1951 Nase .............................. 313/445
5,420,425 A * 5/1995 Bier et al. ...................... 250/292
(Continued)

FOREIGN PATENT DOCUMENTS

CN 1585081 A 2/2005
CN 1838371 A 9/2006
(Continued)

OTHER PUBLICATIONS

State Intellectual Property Office of the People's Republic of China, "International Search Report", China, Aug. 30, 2012.

*Primary Examiner* — Brian K Talbot
(74) *Attorney, Agent, or Firm* — Tim Tingkang Xia, Esq.; Locke Lord LLP (57) ABSTRACT

The present invention provides a method for preparing an ion optical device. A substrate is fabricated with a hard material adapted for a grinding process, the substrate at least including a planar surface, and including at least one insulating material layer. Next, one or more linear grooves are cut on the planar surface, to form multiple discrete ion optical electrode regions on the planar surface separated by the linear grooves. Then, conductive leads are fabricated on other substrate surfaces than the planar surface and in a through hole inside the substrate, to provide voltages required on ion optical electrodes. By using high-hardness materials in cooperation with high-precision machining, higher precision and a desired discrete electrode contour can be obtained.

20 Claims, 7 Drawing Sheets

(51) Int. Cl.
*B05D 3/00* (2006.01)
*C23C 14/34* (2006.01)
*H01J 49/06* (2006.01)
*H01J 49/42* (2006.01)
*H01J 37/04* (2006.01)
*C23C 14/00* (2006.01)
*C23C 18/18* (2006.01)
*C23C 14/04* (2006.01)
*H05K 1/11* (2006.01)
*H05K 3/00* (2006.01)
*H05K 3/14* (2006.01)

(52) U.S. Cl.
CPC ............... *H01J 37/04* (2013.01); *H01J 49/063* (2013.01); *H01J 49/421* (2013.01); *C23C 14/0021* (2013.01); *C23C 14/046* (2013.01); *C23C 18/1806* (2013.01); *H05K 1/119* (2013.01); *H05K 3/0014* (2013.01); *H05K 3/14* (2013.01)

(56) References Cited

U.S. PATENT DOCUMENTS

| | | | | |
|---|---|---|---|---|
| 6,838,666 | B2 * | 1/2005 | Ouyang et al. | 250/292 |
| 7,807,963 | B1 * | 10/2010 | Bier | 250/283 |
| 7,960,693 | B2 * | 6/2011 | Syms et al. | 250/292 |
| 2004/0135080 | A1 | 7/2004 | Ouyang et al. | |
| 2005/0061767 | A1 * | 3/2005 | Pai et al. | 216/2 |

FOREIGN PATENT DOCUMENTS

| | | |
|---|---|---|
| JP | 63037552 A | 2/1988 |
| TW | I313876 B | 8/2009 |
| WO | 03067623 A1 | 8/2003 |
| WO | 2006086294 A2 | 8/2006 |

* cited by examiner

METHOD FOR MANUFACTURING ION OPTICAL DEVICE

CROSS-REFERENCE TO RELATED APPLICATIONS

This application is a continuation application of International Patent Application No. PCT/CN2012/076196, filed May 29, 2012, which itself claims the priority to Chinese Patent Application No. 201110146810.4, filed Jun. 1, 2011 in the State Intellectual Property Office of P.R. China, which are hereby incorporated herein in their entireties by reference.

FIELD OF THE INVENTION

The present invention relates generally to the field of mass spectrum analysis, and more particularly to a method for preparing a two-dimensional planar ion optical device.

BACKGROUND OF THE INVENTION

In order to fabricate an ion optical device capable of forming a certain electric field distribution in a space, it is often necessary to machine an ion optical lens with a complex surface. By taking a two-dimensional linear ion trap as an example, its main body usually requires two pairs of quadrupole field electrodes (refer to PCT Application Publication No. WO2003/067623 A1) with a hyperbolic cylindrical surface. In order to avoid difficulty in machining the quadrupole field electrodes with the hyperbolic cylindrical surface, a manner of using a planar structure to replace a curved structure is also proposed, for example, US20040135080A1. In order to improve field perfection, a Chinese Patent with Patent No. ZL200410024946 describes a planar linear ion trap mass analyzer constructed with a printed circuit board. Such a two-dimensional linear ion trap consists of a main body portion and end caps at two ends of the main body portion.

Figure 1:
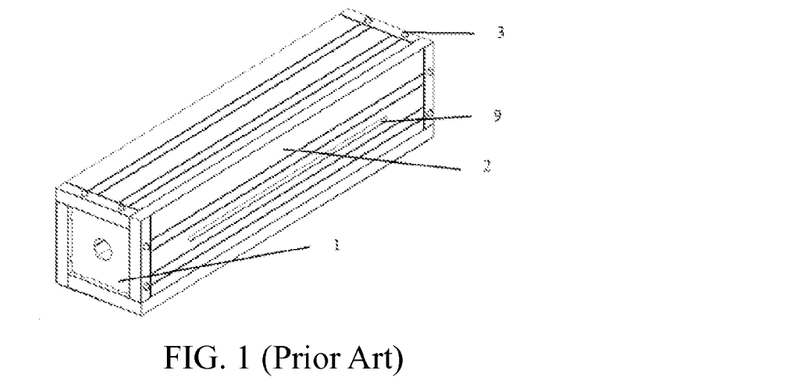
FIG. 1 is a structural view of an existing two-dimensional linear ion trap.

FIG. 1 is a structural view of a typical two-dimensional linear ion trap. A slot 4 on a main body portion 2 is used for ion extraction. In use, a Direct Current (DC) voltage applied to the two end caps 1 and 3 is higher than that applied to the main body portion 2, and in addition, an RF voltage varying with time is further applied to the main body portion 2, for the purpose of generating a quadrupole filed inside the linear ion trap. When an ion (a positive ion is taken as an example) meets a quadrupole stability condition, a Radio Frequency (RF) electric field applied perpendicular to an axial direction of the ion trap and a DC electric field applied parallel to the axial direction of the ion trap are bound, and mass analysis also can be performed at this time, so as to achieve the purpose of ion storage and ion analysis.

Figure 2A:
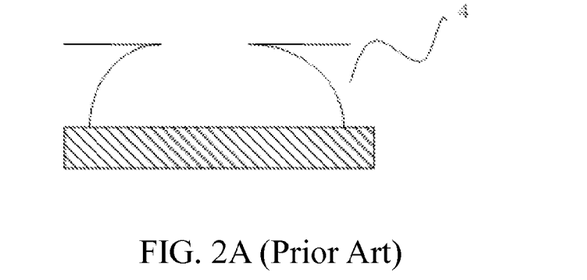
FIG. 2A to FIG. 2C illustrate various adverse consequences caused through a corrosion process used by the existing two-dimensional linear ion trap.
Figure 2B:
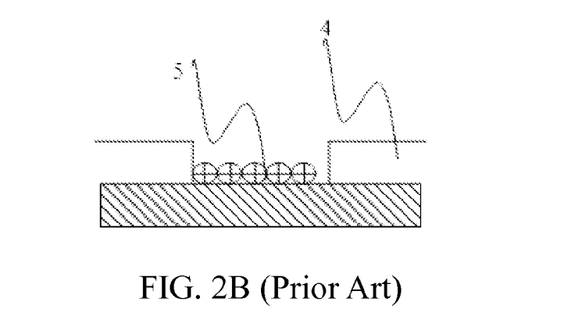
Figure 2C:
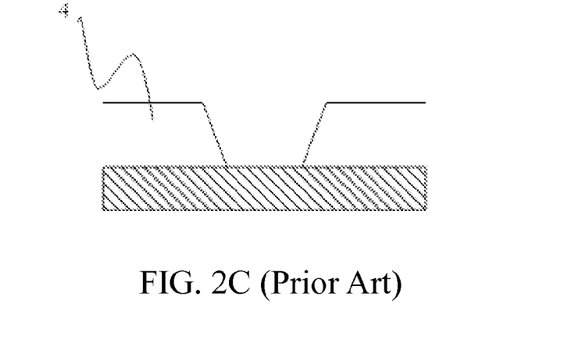

A substrate typically used for a printed circuit is an FR4 type epoxy resin fiberboard, and the material will release various gases adsorbed in a vacuum environment, which is not suitable for a vacuum environment where the ion trap works (the vacuum degree reaches $10^{-1}$-$10^{-4}$ Torr). Moreover, for such a material, processes of photolithography and corrosion of metal coatings on the surface of the printed circuit board are often used to make discrete electrodes having high symmetry. FIG. 2A to FIG. 2C illustrate three adverse consequences possibly generated through the above corrosion process. The corrosion process defines that the corrosion depth may not be very deep, which means, the grooves with depth-to-width ratio (aspect ratio) larger than or equal to one could not be easily fabricated or accurately controlled. Therefore either it may result in that the corrosion time is too long to undermine morphology of a metal electrode 5, as shown in FIG. 2A or the corrosion depth is too shallow so that an electrode player with a depth more than 0.2 mm cannot be made on the surface, which results in that a charge 6 is easily accumulated in regions between the discrete electrodes 5 during use of the device, as shown in FIG. 2B, and the accumulated charge 6 easily forms an electric field in a space other than the electrode surface, causing distortion of the quadrupole field inside the ion trap, and affecting ion trap mass analysis capability. Even if appropriate depth and width parameters can be found, as concentration of a corrosive liquid will become smaller with change of time in a region where it contacts with metal, the corrosion speed becomes slow with change of time, with the consequence that the morphology of the corroded metal electrode 5 is trapezoidal, as shown in FIG. 2C. Situations shown in FIG. 2A and FIG. 2C all may cause deterioration of position accuracy and collimation of the electrode pattern, and affect field distribution in the trap, thereby adversely affecting transmission or analysis performance of the ion optical device.

There are other methods used for fabricating isolated electrodes. In TW200733149A the author disclosed a method for preparing a kind of chip resistor, in which transverse separated lines parallel to each other could be generated one by one using separated linear cutting. These lines could be also cut the component surface into certain depth to form electrodes which may be separated as well. Using this method, separated electrodes described in patent CN1838371 could be fabricated. However, the previous cutting method can only fabricate full planar electrodes and can not realize highly accurate electrodes formation, such as less than 5 microns in tolerance. Also, the integrated error from each cutting will further enlarge the inaccuracy. In precise ion optics as mass analyzer or mobility analyzer, the insulator on the planar will cause surface charge problem, and better tolerance must be guaranteed in order to obtain excellent mass analysis performances, especially for planar quadrupole and ion trap analyzers.

SUMMARY OF THE INVENTION

The technical problem to be solved by the present invention is to provide a method for preparing an ion optical device with high precision and low surface charge, so as to overcome various defects caused by the existing method.

The technical solution adopted by the present invention to solve the above technical problem is to provide a method for preparing an ion optical device. A substrate is fabricated with a hard material adapted for a grinding process, the substrate at least including a planar surface, and including at least one insulating material layer. Next, one or more linear grooves are cut on the planar surface, to form multiple discrete ion optical electrode regions on the planar surface separated by the linear grooves. Then, conductive leads are fabricated on other substrate surfaces than the planar surface and in a through hole inside the substrate, to provide voltages required on ion optical electrodes.

To achieve machining of symmetry precision and straightness of the linear grooves, the present invention further proposes using different methods according to different substrate materials. According to one embodiment, a high-speed rotating rotary-wheel type emery blade is used to grind the planar surface of the substrate, and the blade makes, with respect to the substrate, a linear motion along a direction parallel to the planar surface and perpendicular to an axis of rotation of the blade. Preferably, a set of emery rotary-wheel blades with multiple blades coaxial can be used for cutting, and a gasket precisely ground in thickness is used between adjacent blades to accurately control a distance between the blades. Such a method is applied to the situation where the substrate is made of a single insulating hard material.

According to another embodiment, the existing scribing process in the semiconductor industry can be used to control various indicators of the processed linear grooves. Such a method is applied to a multi-layer structure where the substrate is prepared through a bonding process, especially the situation where the multi-layer structure includes a doped semiconductor material as a conductive material.

A metal coating is prepared in the discrete electrode regions separated by the linear grooves to form the ion optical electrodes, and in order to obtain a better electric field, it is further proposed to prepare metal coatings on at least one portion of sidewalls of the linear grooves.

According to an embodiment of the present invention, an aspect ratio of at least a part of the linear grooves is greater than or equal to 1.

According to an embodiment of the present invention, the method may include a step of further forming an ion extraction groove for ion extraction on the substrate, the step including: pre-forming an embedded slot for making the ion extraction groove on the substrate, and then using the cutting method to cut through the remaining substrate material on an upper portion of the embedded slot to form the ion extraction groove.

According to an embodiment of the present invention, a method for forming the through hole includes: pre-forming an embedded hole of the through hole on the insulating material layer, and then performing reaming.

According to an embodiment of the present invention, after the linear grooves are cut on the substrate, the planar surface of the substrate may be ground, to reduce a depth of the linear grooves to a predetermined depth.

According to an embodiment of the present invention, metal coatings may be made in the discrete electrode regions separated by the linear grooves to form the ion optical electrodes, and the method includes: forming conductive film layers on the planer surface of the substrate and at least a part of regions on a sidewall of the cut linear grooves to serve as the ion optical electrodes.

According to an embodiment of the present invention, before the bonding process, the method further includes: preparing conductive electrodes on a bonded surface, a side surface, and an opposite surface of the bonded surface of the insulating material and in the through hole, so that the conductive material, after bonding, forms a good electrical contact with the conductive electrodes on a bonding surface.

According to an embodiment of the present invention, metal coatings can be fabricated on the discrete electrode regions separated by the linear grooves and part of regions on inner walls of the linear grooves, and the method includes: evaporation coating, magnetron sputtering or plating.

Through the above technical solution, the present invention, as compared with the prior art, has the following prominent advantages: firstly, by using high-hardness materials in cooperation with high-precision machining, higher precision and a desired discrete electrode contour can be obtained. Secondly, the depth of the linear grooves used for separating and forming working electrodes is greater than or equal to the width thereof, that is, the aspect ratio of the linear grooves is greater than 1, and therefore, it is not easy to accumulate surface charge. Also, in this method, not only the planar features but also the vertical features around the grooved regions can be well controlled. For example, if the vertical grooves go across different layers of hard substrates with electrical conductivity or chemical affinity difference, the vertical electrode structure can also be precise by stopping them at the interval of different layers. This is not easy to be achieved in conventional etching print-circuit board methods.

BRIEF DESCRIPTION OF THE DRAWINGS

In order to make the objectives, features, and advantages of the present invention more comprehensible, specific embodiments of the present invention are further described in detail below with reference to the accompanying drawings, wherein.

DETAILED DESCRIPTION OF THE INVENTION

A two-dimensional planar ion optical device according to embodiments of the present invention has discrete electrodes inside its surface for forming a DC or RF electric field. For example, two ends are each provided with an end cap to serve as devices for ion storage and analysis, such as linear ion traps; the linear ion traps whose end caps are removed can serve as transmission devices for ion transmission, such as ion conduction devices. In addition, such a planar ion optical device also can be applied to a linear ion trap array (ITA), a plate-type ion mobility spectrometer (IMS), a plate-type multi-turn time of flight (multi-turn TOF) spectrometer, and the like.

How to prepare a two-dimensional linear ion trap with a plane-separated structure through plane machining is described in detail below with reference to the accompanying drawings. In an embodiment, a main body of the linear ion trap consists of four substrates disposed along an axial direction. The four substrates are in rotational symmetry with axes, and their inner surfaces have discrete electrode regions, with metal coatings prepared thereon to form ion optical electrodes. To simplify the process, the process of fabricating the four substrates may be exactly the same.

Figure 5:
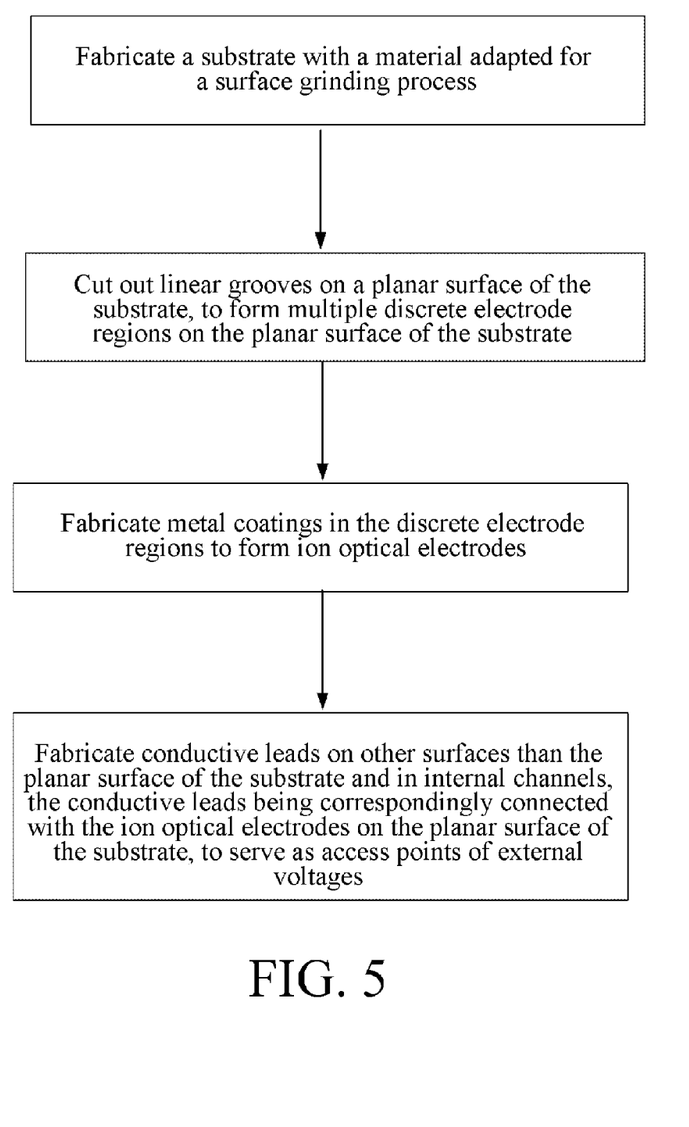
FIG. 5 is a flow chart of a method for preparing an ion optical device according to an embodiment of the present invention.

The whole fabricating process is substantially divided into three parts: preparing substrates, fabricating discrete electrode regions on inner surfaces of the substrates, and preparing metal coatings on the discrete electrode regions. FIG. 5 is a flow chart of a method for preparing an ion optical device according to an embodiment of the present invention.

As it is desired that substrates are processed with such a high-precision machining method as plane grinding machining, it is necessary to select a substrate material suitable for the planar grinding machining. The planar grinding machining requires that the processed substrate should reach certain hardness; otherwise, required machining precision cannot be achieved. In a procedure of selecting the substrate material, it is hoped that the material at least has hardness and a coefficient of thermal expansion of metal (for example, stainless steel) for general machining and at least includes one insulating material layer. A number of non-metallic materials with high hardness are suitable for serving as a substrate material, such as ceramic, silicon, and silicon carbide. It should be noted that, the embodiments of the present invention are not limited to use of a single-layer material, and in order to obtain additional properties, multi-layer material compounding is also optional, for example, a conductive material formed on an insulating substrate, which facilitates forming electrodes directly through cutting. In this step, the substrate material can be previously formed into a desired initial contour according to the basic shape of the substrate in combination with the requirements in a subsequent process.

Next, linear grooves are cut on a planar surface (a plane determined as a work face) of the substrate, to fabricate discrete electrode regions. Herein, according to the selected substrate material, a machine equipped with blades, wheels or other similar tools can be used pertinently to cut and/or grind desired discrete electrode regions on inner surfaces of the substrate.

Afterwards, through fabricating a mask, metal coatings can be formed on surfaces of the discrete electrode regions undergoing cutting and at least a part of regions (if necessary) on sidewalls of insulating slots for separating electrodes, to serve as electrodes. A method for preparing metal coatings usually may include: evaporation coating, magnetron sputtering, plating, photolithography etching, and the like. In an embodiment, if the discrete electrode regions are formed by cutting grooves on a conductive material, the step of plating metal layers in the discrete electrode regions can be omitted.

Moreover, conductive leads are made on other surfaces than the planar surface of the substrate and in internal channels, and the conductive leads are correspondingly connected with ion optical electrodes on the planar surface of the substrate, to serve as access points of external voltages.

In the following embodiments, by taking machining of one substrate therein as an example, the detailed procedure of plane machining of the present invention is introduced in detail.

First Embodiment

1. Prepare a Substrate

In this embodiment, ceramic is selected as a substrate material for machining. The ceramic may be, for example, alumina, zirconia, or a mixture thereof according to a proportion.

Figure 3A:
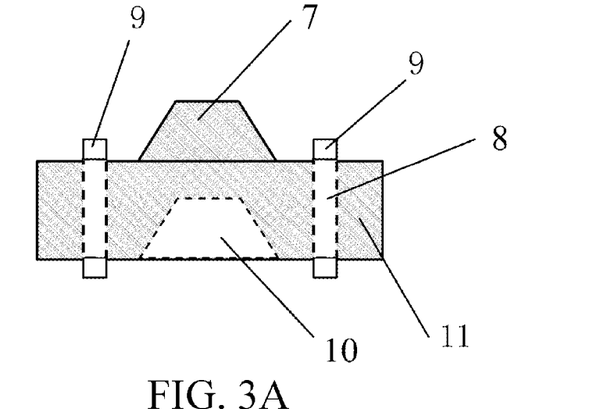
FIG. 3A to FIG. 3F illustrate a flow of a method for preparing an ion optical device according to a first embodiment of the present invention.

As shown in FIG. 3A, first, it is necessary to press the raw material, that is, ceramic powder, with a mold, and the mold may be used to embed an extraction groove 10 for ion extraction into a ceramic substrate 11; two thin metal rods 9 are also embedded into the substrate 11 for forming a through hole 8 for conducting upper and lower surface electrodes of the ceramic. To counteract stress, a protrusion 7 on the substrate surface is specifically designed. The whole substrate, upon completion of pressing, is fed into a high-temperature furnace, initial sintering is performed for 0.5-1.0 hours in an environment of 900-1000, the initially sintered ceramic sheet is taken out after the furnace temperature is reduced to the room temperature, and finishing is performed on the extraction groove 10 by using a milling method; reaming is performed on the through hole 8 with a emery coated drill or milling cutter, and upon completion, the substrate is put into the high-temperature furnace again and is sintered in an environment of 1200-1500 for 0.5-1.0 hours. Upon completion of sintering, the substrate is taken out and polished, where there are two purposes for polishing: one is to remove the protrusion 7 on the substrate surface, to form a smooth ceramic surface; and the other one is to initially form the dimension of the ceramic.

2. Form Discrete Electrodes

Figure 3B:
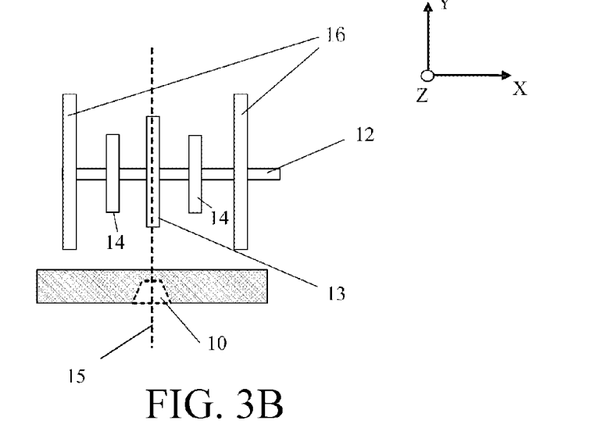

A rapid method for forming discrete electrode regions on a ceramic surface is fixing a ceramic substrate on a machining platform of a grinder, as shown in FIG. 3B. A grinding wheel of the grinder is dressed into a set of emery coated coaxial cutting wheels. A relationship between diameters of the wheels is: the diameter of Wheel 16>the diameter of Wheel 13>the diameter of Wheel 14. The wheel 16 is used for cutting through the ceramic to form the dimension of the ceramic in a width direction; the wheel 14 is used for forming linear grooves between the discrete electrode regions; the width of the wheel 13 is identical with that of an upper bottom surface of the embedded slot 10, for cutting through ceramic on the upper bottom surface of the embedded slot 10 to form the ion extraction groove. The distance between adjacent wheels is precisely controlled, according to machining requirements, with a ceramic gauge block or a gasket precisely milled in thickness. A shaft 12 of the wheels 16, 13, and 14 is driven by a motor.

In machining, a central symmetry plane of the wheel 13 coincides with a center plane of the embedded slot 10, which are labeled as 15 together. The wheels 16, 13, and 14 rapidly rotate under driving of the shaft 12, contact a ceramic substrate and are ground; in the meantime, the shaft 12 makes fast linear movement along a Z direction, and each time it moves to one end of the ceramic, the shaft 12 moves 0.05 mm towards a Y-axis negative direction. Such linear movement is repeated, until the required depth of the linear grooves is obtained through machining. The principle of selecting each wheel diameter is: when the depth of the linear grooves machined by the wheel 14 meets the machining requirements, ensuring that the wheel 13 can cut through the ceramic on the upper bottom surface of the embedded slot 10 and also ensuring that the wheel 16 can cut through the ceramic sheet, to form the dimension of the ceramic substrate in width.

Upon completion of cutting, to ensure smoothness of the ceramic cutting surface, the cutting surface also can be polished, and the polishing thickness is maintained at about 0.05 mm.

Figure 3C:
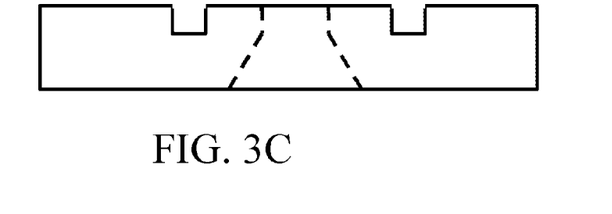

FIG. 3C illustrates a substrate completed through cutting.

3. Prepare Metal Coatings

Figure 3D:
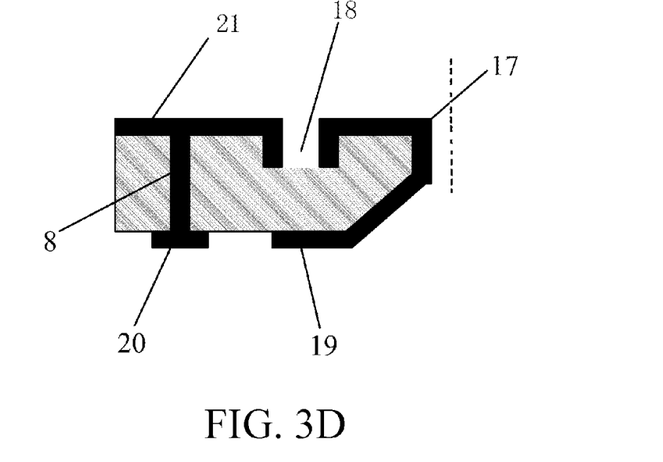
Figure 3E:
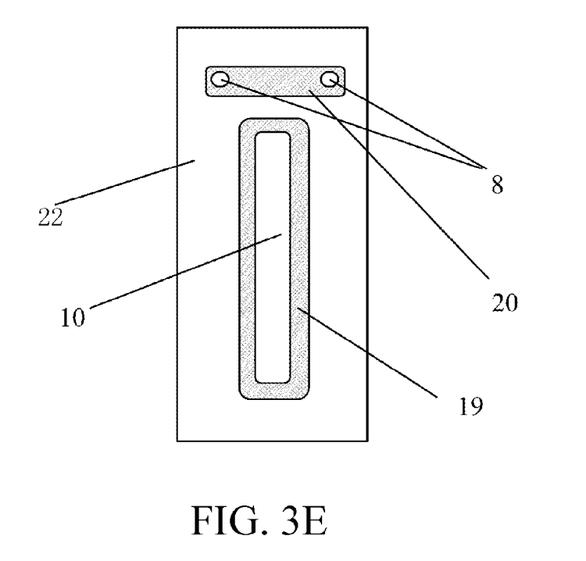
Figure 3F:
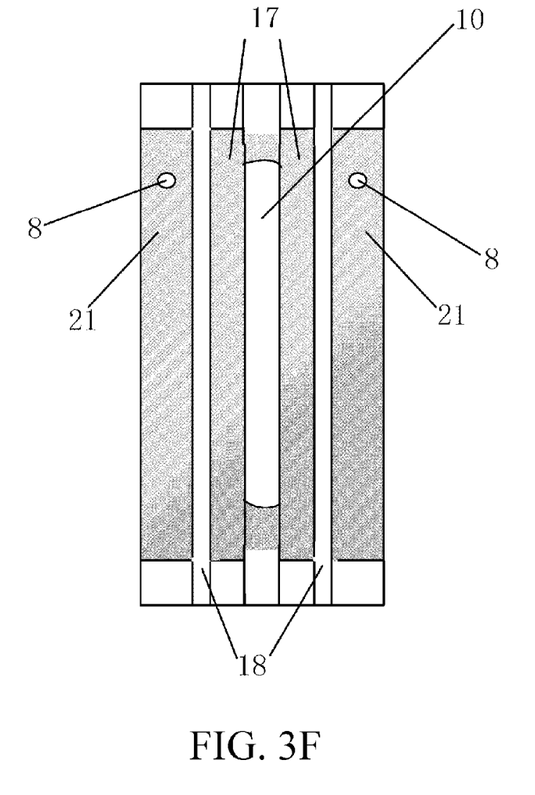

To facilitate description of distribution of metal coatings, FIG. 3D only draws half the width of the ceramic substrate. First, a grouting process is performed, to pour high-temperature silver-palladium paste into the through hole 8, and the substrate is placed into a muffle furnace to be sintered in an environment of 850 for 1.0 hour. Electrodes 17, 21 can be prepared by making a special mold or mask and using a magnetron sputtering method, and electrodes 19, 20 also can be prepared, where the electrodes 17, 21 are used as working electrodes, for the purpose of forming a quadrupole field inside the ion trap; the electrodes 19, 20 are located on a non-working surface of the ceramic substrate, and serve as access points of external voltages. The electrode 19 is connected with the working electrode 17 through a side face of a bellmouth of the ion extraction groove; and the electrode 20 is connected with the working electrode 21 through a conductive silver palladium electrode in the through hole 8. To prevent short-circuit of the working electrodes 17 and 21, a barrier layer may often be placed at the bottom of the linear groove 18, and is removed upon completion of a magnetron sputtering process. The principle of fabricating the barrier layer is: the material of the barrier layer has a small amount of gas emission and is not easily decomposed in an environment of a temperature of 400 and $10^{-2}$-$10^{-3}$ Torr; and the barrier layer should cover the bottom of the linear groove 18 and bare sidewalls of the linear groove 18. In this way, at least a part of regions on the sidewalls of the linear groove 18 will be covered by the metal coatings. The ion optical electrodes thus formed can well minimize the effect of the insulator on the electric field. Upon completion of the magnetron sputtering process, electrode distributions of the non-working face and the working face of the ceramic substrate are as shown in FIG. 3E and FIG. 3F. The ion extraction groove 10 on the surface of the ceramic substrate 22 in FIG. 3E has a bellmouth shape, and the electrode 19 is connected with the working electrode 17 in FIG. 3F through a bellmouth surface; the electrode 20 in FIG. 3E is connected with the working electrode 21 in FIG. 3F through a silver-palladium electrode in the through hole 8 located on the surface of the substrate. The opening of the ion extraction groove 10 in FIG. 3F is obtained through machining using the blade 13 in FIG. 3B; and the linear groove 18 in FIG. 3F is obtained through machining using the blade 14 in FIG. 3B.

Further, to fix the substrate, in the substrate preparation process, while the metal rod 6 in FIG. 3A is embedded, a thick metal rod is embedded in proper positions in four corners of the substrate to form an embedded hole of a mounting hole, and it is also necessary to perform reaming thereon. The position of the mounting hole corresponds to that of a fixing screw hole on the end cap, thereby solving the mounting problem.

Second Embodiment

1. Prepare a Substrate

In this embodiment, glass is selected, for example, borosilicate glass or phosphosilicate glass is used as a substrate material to be machined. Moreover, glass is compounded with silicon to form a complete substrate. Herein, a thicker glass layer, as a material with higher strength, can provide support for the substrate. A silicon wafer is suitable for cutting. In an embodiment, the mature electrostatic bonding process in a micro-electromechanical system (MEMS) is used to prepare the compound substrate.

Figure 4A:
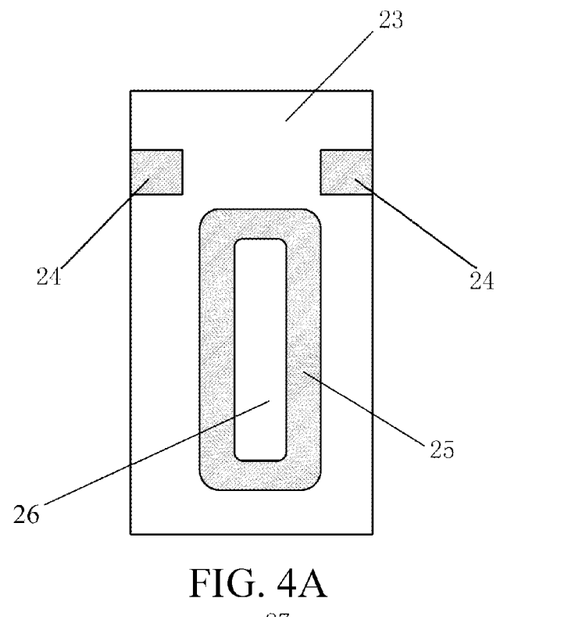
FIG. 4A-FIG. 4F illustrate a flow of a method for preparing an ion optical device according to a second embodiment of the present invention.
Figure 4B:
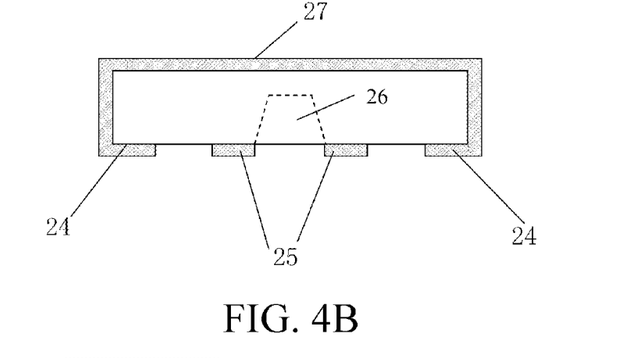

Before the bonding process, it is necessary to process a glass substrate 23, mainly including preparing metal layers 24, 25 and 27 used as electrode leads on a part of the surface and s side of the glass substrate 23; as the bonding depth is only a few microns, the thickness of the prepared electrode is controlled between hundreds of nanometers to 1 micron, and it is required that a stronger binding force exists between the prepared electrodes 24, 25 and the glass substrate 23. After a required electrode pattern is prepared with a vacuum coating method, the pattern can be incubated in a vacuum environment and at a temperature of 200-400 for 0.5-1.0 hours, and the method can improve the binding force between the metal coating and the substrate. In individual cases, if more working electrodes are required, it is necessary to consider preparation and metalization of the through hole. In addition, a bell-shaped embedded slot 26 used as an ion extraction groove should be prepared in advance on the glass 23. Distribution of the electrode leads on the glass 23 is as shown in FIG. 4A and FIG. 4B.

Figure 4C:
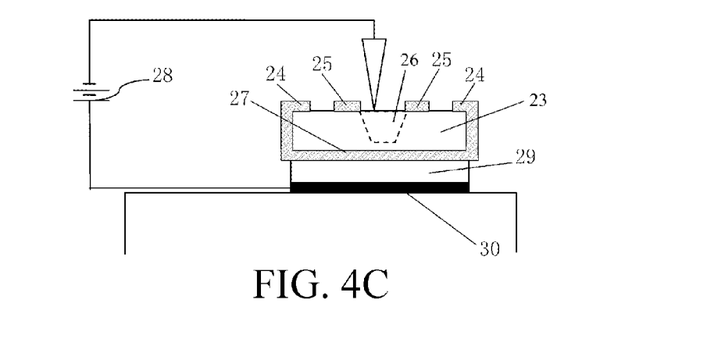

The operation of preparing a required substrate with an electrostatic bonding process is first introduced. FIG. 4C is a schematic view of the electrostatic bonding, and the glass 23 and the silicon wafer 29 are substrates with a flat surface.

The specific procedure of the electrostatic bonding process is described as follows: the silicon wafer 29 is connected to the anode of a DC power source 28; the glass 23 is connected to the cathode of the DC power source 28. The silicon wafer 29 is placed on a temperature-controlled heating plate 30, whose supply voltage is 500-1000 V and temperature is controlled at 300-500. At this time, the resistivity of the silicon wafer 29 becomes very low (about 0.1 $\Omega\cdot$cm) due to intrinsic excitation, and its behavior is similar to the metal; $Na^+$ in the glass 23, under the action of an external electric field, drifts to the cathode of the DC power source 28, to form a depletion layer on the glass surface adjacent to the silicon wafer 29, whose thickness is about several microns ($\mu$m). The depletion layer has negative charge, while the silicon wafer 29 has positive charge; as a small gap or no gap exists between the glass 23 and the silicon wafer 29, a great electrostatic attractive force is formed therebetween, to make the silicon wafer 29 and the glass 23 closely contact with each other. When the silicon wafer 29 and the glass 23 are well bonded, an applied voltage is mainly applied to the depletion layer, the bonding process can be reflected through change of the current: when a voltage is applied just now, there is a large current pulse, then the current decreases, and finally almost decreases to zero, indicating that bonding has been completed. In the electrostatic bonding process, the electrostatic attractive force plays a very important role. In addition, at a high temperature, a silicon-glass interface in close contact may react to form a strong chemical bond, such as Si—O—Si bond. An electrostatically bonded silicon-glass interface circulates at a high temperature-normal temperature-high temperature, and is processed under various conditions such as subjecting to a voltage opposite to a bonding voltage, so that the formed chemical bond is more firmly.

2. Form Discrete Electrodes Through a Cutting Process

Upon completion of the bonding process, the next step is to perform a cutting process. As the silicon wafer is used as a machining material, a common semiconductor machining process, such as a scribing process, is introduced to complete the cutting. The scribing process in the semiconductor industry usually aims to cutting the entire wafer into desired dimensions. Herein, such a mature process is used to machine the discrete electrodes.

Figure 4D:
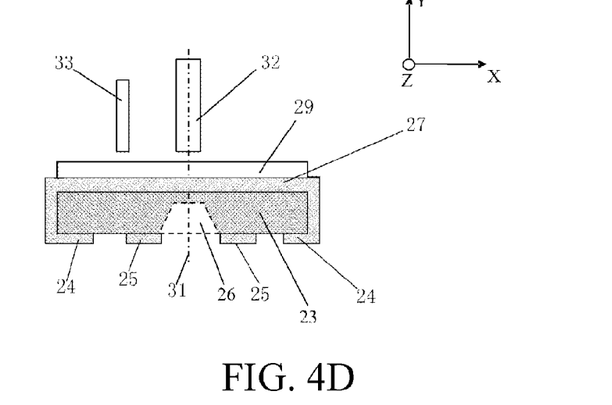

FIG. 4D is a schematic view of a scribing cutting process. The silicon wafer 29 and the glass 23 have been bonded together in the previous process. First, an axis of a scribing blade 32 with an emery coating on its surface and an axis of the glass substrate 23 are aligned, this common axis is labeled as 31, and this step can be performed through operating a scribing machine. The width of the scribing blade 32 is equal to the upper bottom surface of the embedded slot 26 on the glass 23. The rotational speed of the scribing blade 32 is not less than 20,000 rpm per minute, and the scribing blade 32 must make a linear motion along the Z direction, where the linear motion velocity is 6-7 mm/min; and the thickness of the silicon wafer 29 is identical with that of the linear groove to be formed, which is generally not less than 0.3 mm and not more than 0.6 mm. According to the above rotational speed and the linear motion velocity, the scribing blade 32 can be used to cut through the silicon wafer 29, the metal layer 27 and the glass on the upper bottom surface of the embedded slot 26 at the same time, thereby obtaining an ion extraction groove 41 (as shown in FIG. 4E) through machining.

As under normal circumstances, the width of the linear groove is not equal to the width of the ion extraction groove, and it is necessary to change the blade once when machining the linear groove. According to the machining requirements, the changed scribing blade 33 is placed at an appropriate distance from the axis 31. According to the above rotational speed and the linear motion velocity and by setting an appropriate cutting depth, the silicon wafer 29 and the metal layer 27 can be cut through at the same time, and the surface of the glass 23 is bared so as to form a required insulating slot 34 (as shown in FIG. 4F). Similarly, another insulating slot symmetrical with the insulating slot 34 with respect to the axis 31 can be obtained through machining. Such a method overcomes the disadvantage that the corrosion process is affected by the slot depth and the slot width, and through this method, a width of 0.1-1.0 mm and a depth more than 0.3 mm can be obtained through cutting, and a cutting surface is steep; by using a correct cutting speed (e.g., 6-7 mm/min), a smooth cutting surface also can be obtained. Straightness and symmetry of the liner groove machined through a scribing process can achieve various parameter standards required by machining the ion trap.

Figure 4E:
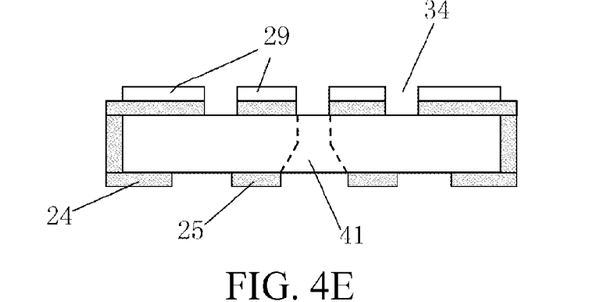
Figure 4F:
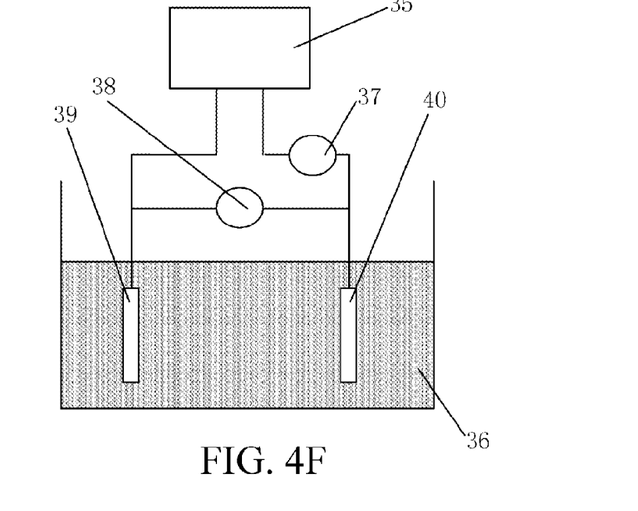

FIG. 4E illustrates a substrate whose cutting has been completed.

3. Prepare Metal Coatings

Upon completion of cutting of the discrete electrode regions, the next step is to prepare metal layers in the discrete electrode regions (including inner walls of linear grooves for separating the electrode regions), for increasing conductivity and protecting the electrode surface. The metal layer also may be prepared by electroplating. As understood by persons skilled in the art, before electroplating, chemical plating (other surfaces are blocked with masks) can be first performed on an inner wall of the ion extraction groove 41 in FIG. 4E, to form a metal coating, thereby facilitating the subsequent electroplating. As shown in FIG. 4F, electrode regions of the cut substrate 39 are respectively connected with a cathode of a power source 35, and are immersed in a plating solution 36 together with an anode 40 of the power source 35; and an ammeter 37 and a voltmeter 38 are used to monitor a current in a loop and an output voltage of the power source 35. Thickness of a plated metal can be controlled through controlling the current and the voltage.

As silicon on the substrate is a semiconductor, and has a certain conductivity; while the glass is a good insulator, the metal only can be plated on the surface of the silicon, and metal will not appear on the surface of the glass, which saves the process of preparing a barrier layer at the bottom of the linear groove.

In a preferred embodiment, in order to efficiently machine multiple linear grooves on the same substrate with high reproducibility, for example, in the situation that a linear ion trap requires electrodes in high symmetry, a set of diamond scribers with a high degree of symmetry can be used to cut through a silicon wafer and a metal layer below the silicon wafer, to bare a glass surface, thereby obtaining a set of insulating slots for separating the electrodes through machining, where the thickness of the blade decides the width of the insulating slots to be cut, and a degree of symmetry of the blade decides symmetric precision of the insulating slots to be cut.

It should be noted that, the bonding process in this embodiment, in addition to being capable of bonding glass and silicon (including silicon carbide) together, can bond materials such as glass, metal and alloys. Generally, the bonding process can bond any materials with a certain electrical conductivity, high flatness and thermally matched together. During bonding, a material with higher strength is selected as a substrate, and a material with lower strength is selected as a material suitable for cutting.

In the ion optical device made according to the above embodiments, by using high-hardness materials in cooperation with high-precision machining, higher precision and a desired discrete electrode contour can be obtained. The depth from the electrode plane to the discrete linear groove may be greater than 0.3 mm, and may be greater than the width of the linear groove, that is, an aspect ratio of a part of or all of the linear grooves is greater than 1, and therefore it is not easy to accumulate surface charge.

The two-dimensional optical device with a planar discrete structure prepared according to the embodiments of the present invention, in addition to being used as an ion trap, can be fabricated into a two-dimensional ITA, used for achieving parallel multi-channel mass analysis detection for multiple ion flows; the device is used as an ion guiding apparatus for transmitting a number of ions with different mass-to-charge ratios in various instruments; in the presence of background gas, the device may be used as a plate-type ion mobility device in an IMS, used for separating and detecting ions with different gas-phase ionic mobilities; when different DC voltages are applied to discrete electrodes, the device may be used as an ion optical reflector in a reflecting TOF spectrometer.

The present invention has been disclosed through preferred embodiments, but is not intended to be limited thereto. Modifications and improvements made by any person skilled in the art without departing from the spirit and scope of the present invention should fall within the protection scope of the present invention as defined by the appended claims.

What is claimed is:

1. A method for preparing an ion optical device, comprising:
    fabricating a substrate that is adapted for a grinding process, the substrate comprising at least one planar surface, and at least one insulating material layer;
    cutting one or more linear grooves on the planar surface, to form multiple discrete ion optical electrode regions on the planar surface separated by the linear grooves;
    fabricating metal coatings on the discrete ion optical electrode regions and side-walls of the linear grooves to form ion optical electrodes; and
    fabricating conductive leads on other surfaces of the substrate and surfaces of through holes inside the substrate, to provide required voltages on the ion optical electrodes.

2. The method according to claim 1, wherein an aspect ratio of at least a part of the linear grooves is greater than or equal to 1.

3. The method according to claim 1, wherein the step of cutting the one or more linear grooves comprises:
    using a high-speed rotating rotary-wheel emery blade to grind the planar surface, and the blade making, with respect to the substrate, a linear motion along a direction parallel to the planar surface and perpendicular to an axis of rotation of the blade.

4. The method according to claim 3, wherein the rotary-wheel emery blade is a blade with multiple blades coaxially disposed.

5. The method according to claim 4, further comprising:
    placing a gasket precisely ground in thickness between adjacent blades to control a distance between the adjacent blades.

6. The method according to claim 3, further comprising forming an ion extraction groove for ion extraction on the substrate, the step of forming the ion extraction groove comprising:

pre-forming an embedded slot for fabricating the ion extraction groove on the substrate, and then using the cutting method to cut through the remaining substrate material on an upper portion of the embedded slot to form the ion extraction groove.

7. The method according to claim 1, wherein each through hole is formed by pre-forming an embedded hole of the through hole on the insulating material layer, and then performing reaming.

8. The method according to claim 1, wherein after the cutting the linear grooves on the substrate, the method further comprises: performing the grinding process on the planar surface to reduce a depth of the one or more linear grooves to a predetermined depth.

9. The method according to claim 1, wherein the step of fabricating metal coatings in the discrete electrode regions separated by the linear grooves to form the ion optical electrodes comprises:

forming conductive film layers on the planer surface and at least a part of regions on a sidewall of the cut one or more linear grooves, to serve as the ion optical electrodes.

10. The method according to claim 1, wherein the step of fabricating metal coatings on the discrete electrode regions separated by the linear grooves and part of regions on sidewalls of the linear grooves comprises: evaporation coating, magnetron sputtering or plating.

11. The method according to claim 1, wherein the ion optical device is an ion mass analyzer device for distinguishing ions with different mass-to-charge ratios.

12. The method according to claim 1, wherein the ion optical device is a linear ion trap or an array thereof.

13. The method according to claim 1, wherein the ion optical device is an ion mobility spectrum analyzer for distinguishing ions with different gas-phase ion mobilities.

14. The method according to claim 1, wherein the ion optical device is an ion conduction device for transmitting ions with different mass-to-charge ratios.

15. The method according to claim 1, wherein the substrate is formed of a single insulating material.

16. The method according to claim 15, wherein the step of fabricating metal coatings in the discrete electrode regions separated by the linear grooves to form the ion optical electrodes comprises:

forming conductive film layers on the planer surface and at least a part of regions on a sidewall of the cut one or more linear grooves, to serve as the ion optical electrodes.

17. The method according to claim 15, wherein the single insulating material is ceramic.

18. The method according to claim 1, wherein the substrate is a multi-layer substrate formed through a bonding process by using an insulating material and a conductive material, and the conductive material comprises a doped semiconductor material.

19. The method according to claim 18, wherein before the bonding process, the method further comprises: preparing conductive electrodes on a bonded surface, a side surface, and an opposite surface of the bonded surface of the insulating material and in the through hole, so that the conductive material, after bonding, forms an electrical contact with the conductive electrodes on a bonding surface.

20. The method according to claim 18, wherein the substrate is formed of glass and a silicon wafer through electrostatic bonding.

* * * * *